United States Patent

Moriyasu

[15] 3,639,785

[45] Feb. 1, 1972

[54] PULSE GENERATOR

[72] Inventor: Hiro Moriyasu, Portland, Oreg.

[73] Assignee: Tektronix, Inc., Beaverton, Oreg.

[22] Filed: Jan. 21, 1969

[21] Appl. No.: 792,502

[52] U.S. Cl. ..............................307/288, 307/255, 307/262
[51] Int. Cl. ..............................H03k 17/60
[58] Field of Search ..............................330/69; 307/262, 255, 288

[56] References Cited

UNITED STATES PATENTS

| | | | |
|---|---|---|---|
| 2,948,820 | 8/1960 | Bothwell | 307/288 |
| 3,213,294 | 10/1965 | Okuda | 307/255 |
| 3,259,756 | 7/1966 | Meier et al. | 307/255 |
| 3,458,727 | 7/1969 | Watkins | 307/255 |
| 3,359,433 | 12/1967 | Thauland | 307/262 |
| 3,205,445 | 9/1965 | Cubert | 307/262 |
| 3,292,098 | 12/1966 | Bensing | 307/262 |
| 3,433,978 | 3/1969 | Bongenaar et al. | 307/262 |

*Primary Examiner*—Donald D. Forrer
*Assistant Examiner*—Harold A. Dixon
*Attorney*—Buckhorn, Blore, Klarquist and Sparkman

[57] ABSTRACT

A pulse generator includes first and second pairs of transistors forming current switches wherein each pair receives current at a common emitter connection. A load is connected to the collector terminals of the second transistor of each pair, while the collector of the first transistor of each pair drives the base of the second transistor in the opposite pair.

11 Claims, 1 Drawing Figure

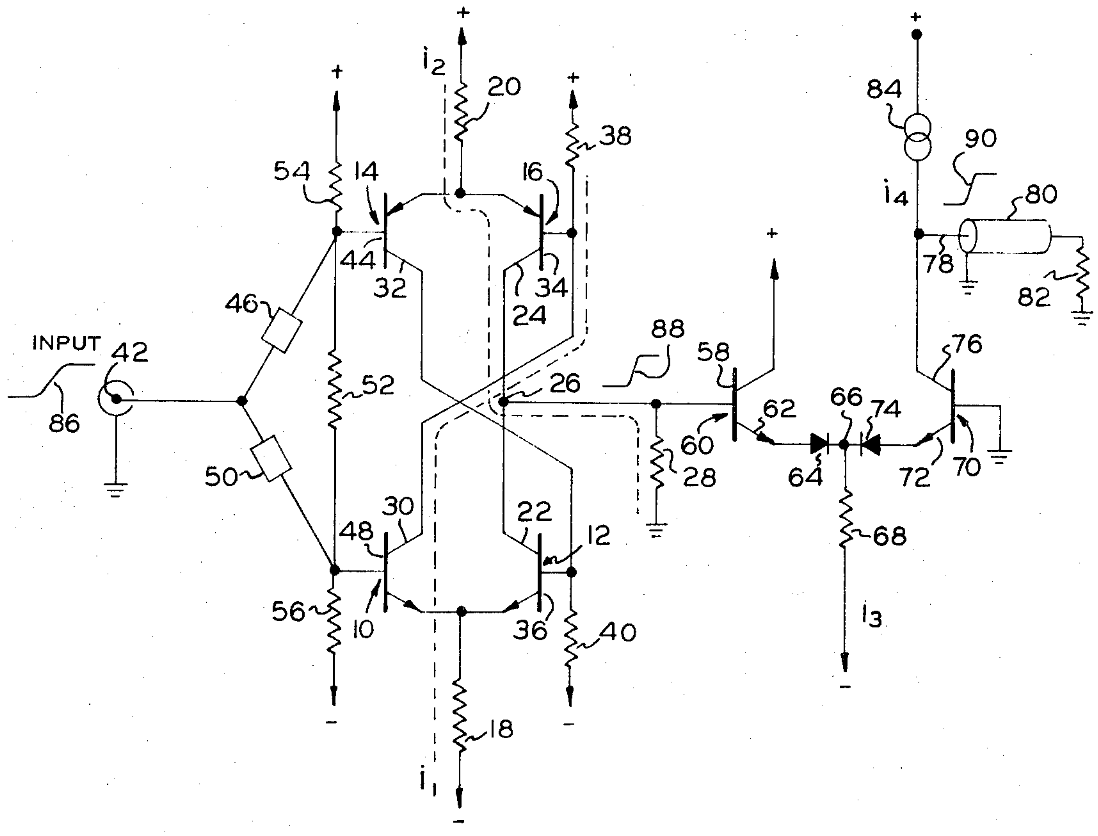
HIRO MORIYASU
*INVENTOR*
*BY*
*BUCKHORN, BLORE, KLARQUIST & SPARKMAN*
*ATTORNEYS*

PULSE GENERATOR

BACKGROUND OF THE INVENTION

An ideal pulse generator would satisfy requirements of a high switching speed, high repetition rate of pulse output, and large power output. In the case of most pulse generators, one of these qualities is sacrificed in order to gain the advantage of one or more of the others. For example, a tunnel diode has a very rapid switching time and can operate at a high switching rate, but is characterized by a relatively low voltage output.

Standard bistable circuits, e.g., Schmitt trigger circuits, provide medium power output. Thus, all the available current is not switched to and from a load, but some is normally dissipated in a load resistor. Also, switching time and repetition rate in conventional bistable circuits is slowed by the RC feedback means usually employed. A mercury pulser can provide high power output and a relatively fast switching time, but the repetition rate is poor. The repetition rate of circuits employing avalance transistors is also slow, although power output is better than average.

A popular pulse generator circuit having fair overall characteristics comprises several cascaded stages of overdriven amplifiers. The gain-bandwidth product per stage is limited and therefore in order to produce fast switching, the gain per stage must be limited. As a consequence, the number of stages is multiplied and the circuit tends to become quite complex. The last stage in the overdriven amplifier circuit can provide high power output and relatively rapid switching, but the first stage will usually operate more slowly. As a result, the repetition rate of the circuit is reduced.

SUMMARY OF THE INVENTION

According to the present invention, a pulse generator comprises a pair of current switches for alternatively applying current to a load. Each current switch comprises a pair of active devices, such as transistors or vacuum tubes, supplied with a current at a common terminal connection. The current switches are advantageously constructed employing transistors of a first conductivity type in one switch and a complementary conductivity type in the other. In addition to the direct coupling at the common terminal connection in each current switch, the current switches are also direct-coupled to one another in cross-coupled fashion, causing the current switches to alternatively provide current to a load in the reverse direction.

When either current switch is triggered, the opposite current switch, operating as a direct-coupled amplifier means, provides feedback causing rapid transition. As a result of the tight regenerative coupling between the current switches, high speed and high current gain operation is possible in a single stage resulting in fast rise time and high pulse repetition rate capabilities. Power output is also enhanced as a consequence of providing reversal of load current from a maximum value in one direction to a maximum value in the other. Pulse risetimes of 450 picoseconds have been obtained with a repetition rate of 400 to 500 megahertz, producing a 5-volt pulse into a 50-ohm load.

The circuit according to the present invention is useful in any instance where pulse generation or pulse shaping is desired.

It is therefore an object of the present invention to provide an improved pulse generator having the characteristics of fast switching and high pulse repetition rates with increased power output.

It is a further object of the present invention to provide an improved fast operating pulse generator of simplified construction providing increased power output.

It is a further object of the present invention to provide an improved pulse generator exhibiting decreased power dissipation.

It is a further object of the present invention to provide an improved pulse generator comprising a single tightly coupled stage.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawing wherein like reference characters refer to like elements.

DRAWING

The single FIGURE is a schematic diagram of a pulse generator according to the present invention.

DETAILED DESCRIPTION

Referring to the drawing, the pulse generator according to the present invention comprises a first pair of active circuit devices or amplifier devices, here comprising transistors 10 and 12, and a second pair of active circuit devices or amplifier devices, here comprising transistors 14 and 16. Other active amplifying devices, for example vacuum tubes, may alternatively be employed. However, the amplifying devices are desirably transistors, and the first two, 10 and 12, are advantageously of a first polarity type, e.g., NPN, and the second two, 14 and 16, are advantageously of the complementary type, e.g., PNP.

Each amplifying device is provided with a control terminal, an output terminal, and a common terminal, which, in the case of the transistors, respectively constitute a base, a collector, and an emitter. The common or emitter terminals of each pair are connected together. In the case of transistors 10 and 12, the emitter terminals are returned to a negative source through resistor 18. Resistor 18 is relatively large in value for delivering a relatively constant current at the emitter terminals of transistors 10 and 12. Similarly, the emitters of transistors 14 and 16 are returned to a positive source via resistor 20 which is relatively large in value for delivering a relatively constant current to the latter common emitter connection.

The collectors 22 and 24 of the second transistors 12 and 16 respectively of each pair are connected to a common output or load terminal 26, load resistor 28 being coupled between terminal 26 and ground. The collector terminals 30 and 32 of the first transistors 10 and 14 of each pair are each direct-coupled to the base terminal of the second transistor of the opposite pair, in cross-coupled configuration. Thus, collector 30 of transistor 10 is connected to base 34 of transistor 16, while collector 32 of transistor 14 is connected to base 36 of transistor 12. Base 34 is returned to a positive voltage through resistor 38, and base 36 is returned to a negative voltage through resistor 40.

An input terminal 42 is coupled to base 44 of transistor 14 through impedance 46, as well as to base 48 of transistor 10 by way of impedance 50. Impedances 46 and 50 suitably comprise resistors or capacitors, or a parallel combination thereof. The bases 44 and 48 are joined by resistor 52 while base 44 is returned to a positive voltage employing resistor 54 and base 48 is returned to a negative voltage with resistor 56. The load terminal 26 is connected to the base 58 of NPN-transistor 60, while the collector of transistor 60 is connected to a positive voltage. Emitter 62 of transistor 60 is coupled via switching diode 64 to a terminal 66, and a resistor 68 is located between terminal 66 and a negative voltage point. An NPN-transistor 70 has its base grounded and its emitter 72 coupled by way of switching diode 74 to the terminal 66. The cathodes of both diodes 64 and 74 are connected to terminal 66. Collector 76 of transistor 70 is connected to the center conductor 78 of 50-ohm coaxial cable 80, the outer conductor of which is grounded. At the opposite end of the cable, the center conductor is connected to one end of 50-ohm load resistor 82 having its opposite end grounded. A DC offset current source 84 is interposed between a positive terminal and collector 76 of transistor 70.

The pairs of transistors 10, 12 and 14, 16 respectively operate as current switches to switch currents $i_1$ and $i_2$ alternatively through load resistor 28. Thus, either transistor 16 is on whereby current $i_2$ is provided at load terminal 26 via collector 24, or transistor 12 conducts for providing current $i_1$ at load terminal 26 via collector 22. The resultant output pulse voltage across resistor 28 thus changes from one polarity to the other as a result of transition of the current switches. Moreover, it will be seen that no additional standby current is drawn, but rather, all the output current is employed in a first direction, or the reverse direction, thereby enhancing the output power developed and the magnitude of the output pulse.

The transistor pair 10, 12 may be viewed as a fast switching pair or Schmitt circuit, while transistors 16, 14 comprise direct-coupled amplifier feedback means located between the collector 30 of transistor 10 and the base 36 of transistor 12. In addition, the direct-coupled amplifier 16, 14 alternatively drives the terminal 26. The tight regenerative cross-coupling or feedback coupling between the two pairs results in a circuit capable of operating with fast switching speed and high pulse repetition rate while providing desirably high output power as compared with most prior circuits.

Considering the operation of the present invention, let us assume that transistor 14 is initially conducting, and transistor 10 is initially nonconducting. Therefore, all of the current $i_2$ from resistor 20 will pass through transistor 14 and resistor 40. Similarly, all the current $i_1$ from resistor 18 is delivered through transistor 12 to load terminal 26 and load resistor 28.

Now assume a positive going input 86 is delivered to input terminal 42. This positive transition is coupled by impedance 50 to base 48 of transistor 10, turning on transistor 10. Since a substantially constant current is provided through resistor 18, transistor 10 takes current away from transistor 12, tending to turn transistor 12 off. At the same time, since the collector 30 of transistor 10 is coupled to the base 34 of transistor 16, the negative-going voltage at collector 30 tends to turn transistor 16 on. Since a substantially constant current is provided through resistor 20, transistor 16 takes current from transistor 14. The voltage at collector 32 of transistor 14, which is also the voltage across resistor 40, will drop, and therefore transistor 12 will tend to be driven farther toward nonconduction. Therefore, less current is taken by transistor 12 from resistor 18, and more supplied to transistor 10. A fast transition provided by the tightly coupled or direct-coupled feedback configuration produces a steep output step pulse 88 as transistor 10 turns on and transistor 14 turns off. The transition time is on the order of 450 picoseconds.

Amplification is provided by the feedback amplifier comprising transistors 16 and 14, and also since operation is regenerative, transistor 10 turns on very rapidly and transistor 12 turns off very rapidly in response to the positive-going input. It should be noted that transistor 10 thus operates transistor 12 at both the base and emitter of transistor 12. Similarly, transistor 16 is driven at both its base and emitter. In each case, a fast transition occurs, resulting in a rapid transition at load terminal 26. Current gain and speed are optimized during switching transitions due to the tight circuit coupling.

Input signal 86 is also coupled by means of impedance 46 to base 44 of transistor 14. This positive-going input tends to turn off transistor 14. As a result, less current is taken by transistor 14 from resistor 20 causing increased conduction in transistor 16. At the same time, the collector 32 draws less current through resistor 40, tending to turn transistor 12 off whereby more current will be supplied through resistor 18 to transistor 10. The increased current through transistor 10 drawn through resistor 38 drives transistor 16 farther into conduction. Thus, transistors 14 and 16 may be viewed as a Schmitt circuit, with transistors 12 and 10 operating as a tightly coupled feedback amplifier.

The resultant flows of currents $i_1$ and $i_2$ are indicated in dashed lines on the drawing. It is thus seen the initial condition current flow of $i_1$ through resistor 28 has changed to a current flow, $i_2$, in the completely opposite direction, thus providing a double amplitude output pulse. As the circuit switches the currents $i_1$ and $i_2$, no saturation occurs in any of the transistors. The maximum current provided is desirably less than a saturation value, and the speed of operation of the circuit is enhanced for this additional reason. It should also be noted that feedback circuit operation is independent of the output load. That is, the load terminal 26 is not connected to, nor a part of a feedback path. Therefore, changes in load will have substantially no effect upon the output provided in response to an input transition. Other components may be substituted for load resistor 28. For example, a capacitor may be utilized at this location to provide a different rise and fall time output. However, the speed of transition of the stage and the repetition rate of the circuit will not be affected.

Of course, when a negative-going input is supplied at terminal 42, the circuit will switch back to its initial operating condition where $i_1$ is supplied to load resistor 28. The rapid switching in each instance takes place in what may be considered a single stage of tightly coupled transistors 10, 12, 14 and 16.

The circuitry including transistors 60 and 70 comprises an output stage for setting the output pulse height and level. Adjustment of current $i_3$ through resistor 68 is effective for changing the pulse height, while adjustment of current $i_4$ from source 84 sets the DC level. When the transistor 70 is nonconducting, the entire current from source 84 flows through resistor 82 setting the DC level.

In the output stage, either transistor 60 is conducting, or alternatively transistor 70 is conducting. Let us assume the base 58 of transistor 60 has a positive voltage applied thereto as developed across resistor 28. At this time, the current $i_2$ will flow through diode 64 and transistor 60 to the positive supply via the collector of transistor 60. When load terminal 26 is driven negative, i.e., when current $i_1$ rather than current $i_2$ flows in resistor 28, transistor 60 is cut off, and the current $i_3$ flows through diode 74 and transistor 70, thereby reducing the current flow through resistor 82. When a positive signal is again applied at base 58 of transistor 60, the situation reverses, and a positive-going output pulse is again produced, as indicated at 90.

In the present application, the term "direct-coupled" is employed to indicate DC coupling, for example direct coupling, or coupling via a DC amplifier wherein coupling capacitors or similar time constant elements are not employed. Terms such as "control terminal," "output terminal" and "common terminal" have been applied in a specific description to the elements of a preferred transistor device. It will be appreciated, however, vacuum tube elements having similar purposes are also comprehended by this terminology, for example the grid, anode and cathode of a vacuum tube.

While I have shown and described a preferred embodiment of my invention, it will be apparent to those skilled in the art that many changes and modifications may be made therein without departing from my invention in its broader aspects.

I claim:

1. A pulse generator comprising:

a first pair of amplifier devices provided with a first common current supply, and a second pair of amplifier devices provided with a second common current supply, each amplifier device having a control terminal, an output terminal, and a common terminal, a load terminal direct coupled to the output terminal of a second of each pair of devices, means direct coupling the control terminal of the second amplifier device of the first pair to receive substantial drive from only the output terminal of the first active device of the second pair, and means direct coupling the control terminal of the second device of the second pair to receive substantial drive from only the output terminal of the first control device of the first pair.

2. The generator according to claim 1 wherein each pair of amplifier devices includes a first amplifier device and a second amplifier device having their common terminals connected together, and a common impedance having a first terminal thereof connected to said common terminals and through which a common current is provided.

3. The generator according to claim 1 wherein the amplifier devices of one pair comprise transistors of a first conductivity type and wherein the amplifier devices of the second pair comprise transistors of the complementary type.

4. The generator according to claim 1 including an input terminal, and coupling means for coupling said input terminal to the control terminals of the first amplifier device of each pair.

5. A pulse generator comprising;

a first pair of transistors having their emitter terminals connected together, and a first impedance connecting said emitter terminals to a first power supply terminal, a second pair of transistors having their emitters connected together, and a second impedance connecting the emitters of said second pair to a second power supply terminal, and a load terminal connected in common to a collector terminal of a second transistor of each pair, wherein the collector terminal of the first transistor of the first pair is regeneratively cross-connected to the base terminal of the second transistor of the second pair without being connected to the collector terminal of the first transistor of the second pair, and wherein the collector terminal of the first transistor of the second pair is regeneratively cross-connected to the base terminal of the second transistor of the first pair.

6. The generator according to claim 5 wherein the transistors of one pair are of the opposite conductivity type from the transistors of the other pair.

7. The generator according to claim 5 including an input terminal, and means connecting the input terminal to the base terminal of the first transistor of each pair.

8. The generator according to claim 5 wherein said first and second impedances have values for limiting the current therethrough to less than would saturate one of said transistors.

9. A pulse generator comprising:

a first current switch including first and second amplifier devices each having a control terminal, an output terminal, and a common terminal, said common terminals being connected to receive a current from a first source, a second current switch also including first and second amplifier devices each having a control terminal, an output terminal, and a common terminal, said common terminals of the last mentioned amplifier devices being connected in common to receive a second current, and means for continuously direct coupling the output terminal of the first amplifier device of the first current switch in regenerative drive relation to the control terminal of the second amplifier device of the second current switch, without also coupling the output terminal of the first amplifier device of the first current switch in regenerative drive relation to the control terminal of the second amplifier device of the first current switch, and for continuously direct coupling the output terminal of the first amplifier device of the second current switch in regenerative drive relation to the control terminal of the second amplifier device of the first current switch, without also coupling the output terminal of the first amplifier device of the second current switch in regenerative drive relation to the control terminal of the second amplifier device of the second current switch.

10. A pulse generator comprising:

first and second amplifier devices each having a control terminal, an output terminal, and a common terminal wherein the common terminals of said first and second devices are direct coupled, direct coupled means for providing amplification, said direct coupled means being driven by the first device and driving the second device with an amplified version of the output of the first device, said direct coupled means comprising third and fourth amplifier devices each having a control terminal, an output terminal, and a common terminal, wherein the common terminals of the third and fourth devices are direct coupled, the control terminal of the fourth device receiving a driving input from the output terminal of the first device, and the output terminal of the third device driving the control terminal of the second device, and a load terminal connected to the output terminals of said second and fourth devices.

11. A pulse generator for providing a pulse output to a load, said generator comprising;

a first current switch including a first pair of active devices, each having a control terminal, an output terminal, and a common terminal, wherein the common terminals are connected and adapted to receive a current from a first current source at such common connection, a second current switch including a second pair of active circuit devices, each having a control terminal, an output terminal, and a common terminal, wherein the common terminals are connected and adapted to receive a second current from a second current source at their common connection, means for coupling the control terminal of one active device of the first current switch to receive drive from substantially only the output terminal of one active device of the second current switch, and means coupling the control terminal of the remaining active circuit device of the second current switch to receive drive from substantially only the output terminal of the remaining active device of the first current switch, for causing said current switches to operate synchronously, a load terminal, and means for direct coupling the said load terminal to receive drive from the said one active device of the first current switch and from the said remaining active device of the second current switch to provide current to the load terminal alternatively from the respective sources of current as said current switches operate synchronously.

* * * * *